(12) United States Patent
Smith et al.

(10) Patent No.: US 6,267,266 B1
(45) Date of Patent: Jul. 31, 2001

(54) NON-CONTACT LIQUID MATERIAL DISPENSER HAVING A BELLOWS VALVE ASSEMBLY AND METHOD FOR EJECTING LIQUID MATERIAL ONTO A SUBSTRATE

(75) Inventors: James C. Smith, Amherst; James W. Messerly, Stow, both of OH (US)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 09/406,178

(22) Filed: Sep. 24, 1999

Related U.S. Application Data

(63) Continuation-in-part of application No. 09/070,946, filed on May 1, 1998, which is a continuation-in-part of application No. 08/682,160, filed on Jul. 17, 1996, now Pat. No. 5,747,102, which is a continuation-in-part of application No. 08/607,126, filed on Feb. 26, 1996, now abandoned, which is a continuation-in-part of application No. 08/559,332, filed on Nov. 16, 1995, now abandoned.

(51) Int. Cl.[7] .................................................... G01F 11/00
(52) U.S. Cl. .................................. 222/1; 222/61; 222/389; 222/496; 222/504; 222/518
(58) Field of Search ................................ 222/1, 61, 146.5, 222/309, 389, 494, 495, 496, 504, 518

(56) References Cited

U.S. PATENT DOCUMENTS

| | | | |
|---|---|---|---|
| 2,025,509 | 12/1935 | Hieber | 219/27 |
| 3,943,527 | 3/1976 | Hartmann | 346/33 C |
| 3,982,724 | 9/1976 | Citrin . | |
| 4,066,188 | 1/1978 | Scholl et al. | 222/146 HE |
| 4,120,086 | 10/1978 | Crandell | 29/611 |
| 4,161,386 | 7/1979 | Osuna-Diaz | 425/549 |
| 4,447,706 | 5/1984 | Eder et al. | 219/299 |
| 4,644,140 | 2/1987 | Hillinger | 219/535 |
| 4,711,379 | 12/1987 | Price | 222/504 |
| 4,753,819 | 6/1988 | Shimada | 427/96 |
| 4,784,582 | 11/1988 | Howseman, Jr. et al. . | |

(List continued on next page.)

FOREIGN PATENT DOCUMENTS

| | | |
|---|---|---|
| 0 423 388 A1 | 4/1991 | (EP) . |
| 2 036 279 | 12/1970 | (FR) . |
| 2 637 520 | 4/1990 | (FR) . |
| WO 84 00922 | 3/1984 | (WO) . |
| WO 97/18054 | 5/1997 | (WO) . |

OTHER PUBLICATIONS

"Dispensing for Surface Mount Shoots into the Future with DispenseJet™ Technology from Asymtek", Asymtek Engineering Tech Report.

"Viscosity and Its Relationship to Fluid Dispensing" by Douglas Shade, Electronic Packaging and Production, Jun. 1991.

Primary Examiner—Joseph A. Kaufman
(74) Attorney, Agent, or Firm—Calfee, Halter & Griswold, LLP

(57) ABSTRACT

An apparatus for dispensing a small amount of a viscous liquid material onto a substrate, the apparatus comprising a housing and piston positioned within the housing and having a lower surface and a flow bore extending therein, the flow bore having an inlet for receiving the viscous liquid material and an outlet. The apparatus further includes a compressible dispensing element positioned within the housing below and in liquid tight sealing engagement with the lower surface of the piston and having a passage extending therethrough, the passage having an inlet in liquid communication with the outlet of the flow bore and an outlet. The lower surface of the piston is capable of applying a force to compress the dispensing element causing the passage to at least partially close expelling a small amount of the viscous liquid material from the outlet of the passage. The apparatus has a nozzle in liquid communication with the outlet of the passage for guiding the small amount of viscous liquid material expelled from the outlet of the passage onto the substrate.

54 Claims, 5 Drawing Sheets

U.S. PATENT DOCUMENTS

| | | | |
|---|---|---|---|
| 4,826,135 | 5/1989 | Mielke | 251/333 |
| 4,848,606 | 7/1989 | Taguchi et al. | 222/333 |
| 4,926,029 | 5/1990 | Pearson | 219/421 |
| 4,942,998 | 7/1990 | Horvath et al. | 228/102 |
| 4,953,755 | 9/1990 | Dennison | 222/146.5 |
| 4,967,933 | 11/1990 | Maiorca et al. | 222/1 |
| 5,052,338 | 10/1991 | Maiorca et al. | 118/668 |
| 5,074,443 | 12/1991 | Fujii et al. | 222/639 |
| 5,151,025 | 9/1992 | Muller | 425/199 |
| 5,205,439 | 4/1993 | Sturn | 222/1 |
| 5,207,659 | 5/1993 | Pennaneac'h et al. | 604/298 |
| 5,266,349 | 11/1993 | Bok | 427/8 |
| 5,277,344 | 1/1994 | Jenkins | 222/504 |
| 5,320,250 | 6/1994 | La et al. | |
| 5,328,085 | 7/1994 | Stoops et al. | 228/33 |
| 5,350,084 | 9/1994 | Miller et al. | 222/137 |
| 5,364,011 | 11/1994 | Baker et al. | 228/180.21 |
| 5,462,199 | 10/1995 | Lenhardt | 222/54 |
| 5,465,879 * | 11/1995 | La et al. | 222/496 |
| 5,524,792 | 6/1996 | Wakabayashi et al. | 222/146.5 |
| 5,524,795 | 6/1996 | Lee | 222/207 |
| 5,738,136 | 4/1998 | Rosenberg | 137/12 |
| 5,747,102 | 5/1998 | Smith et al. | |

* cited by examiner

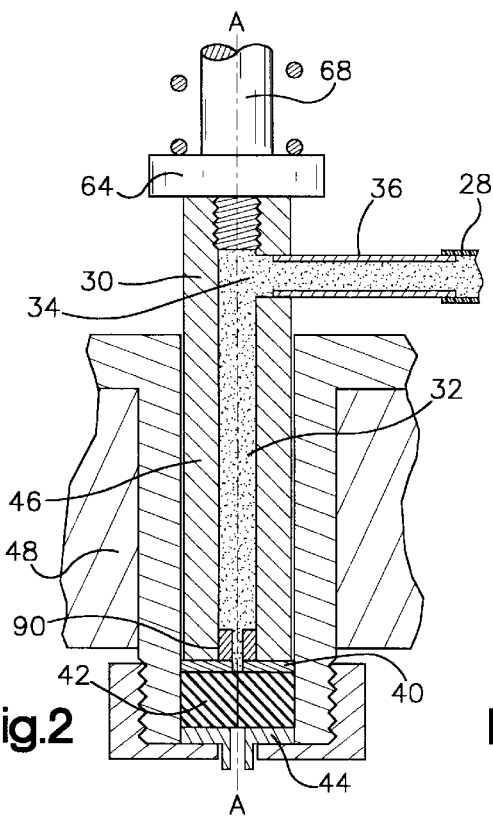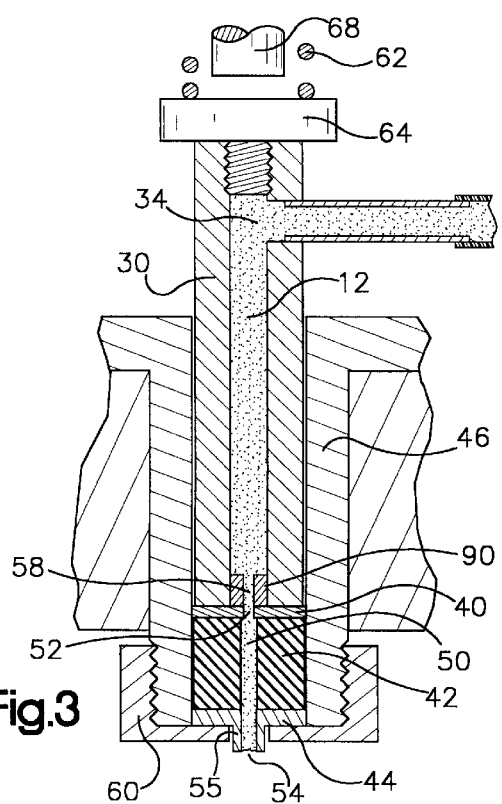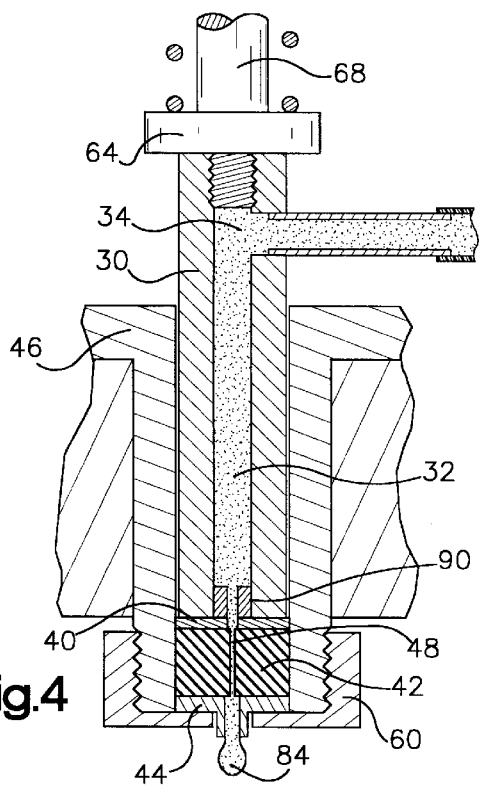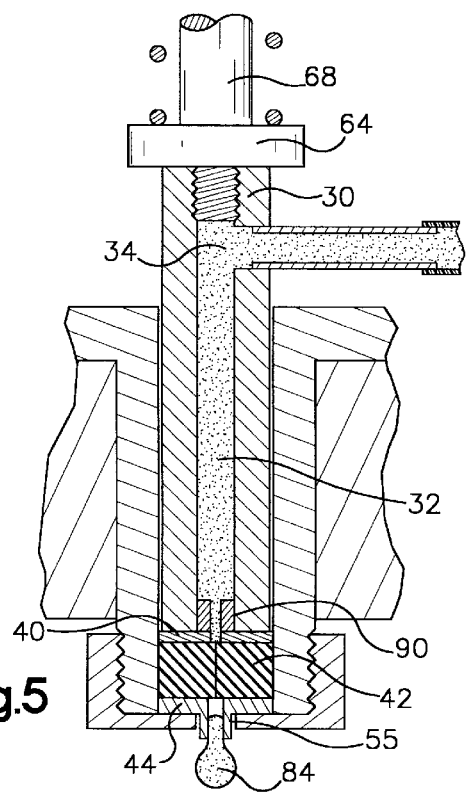

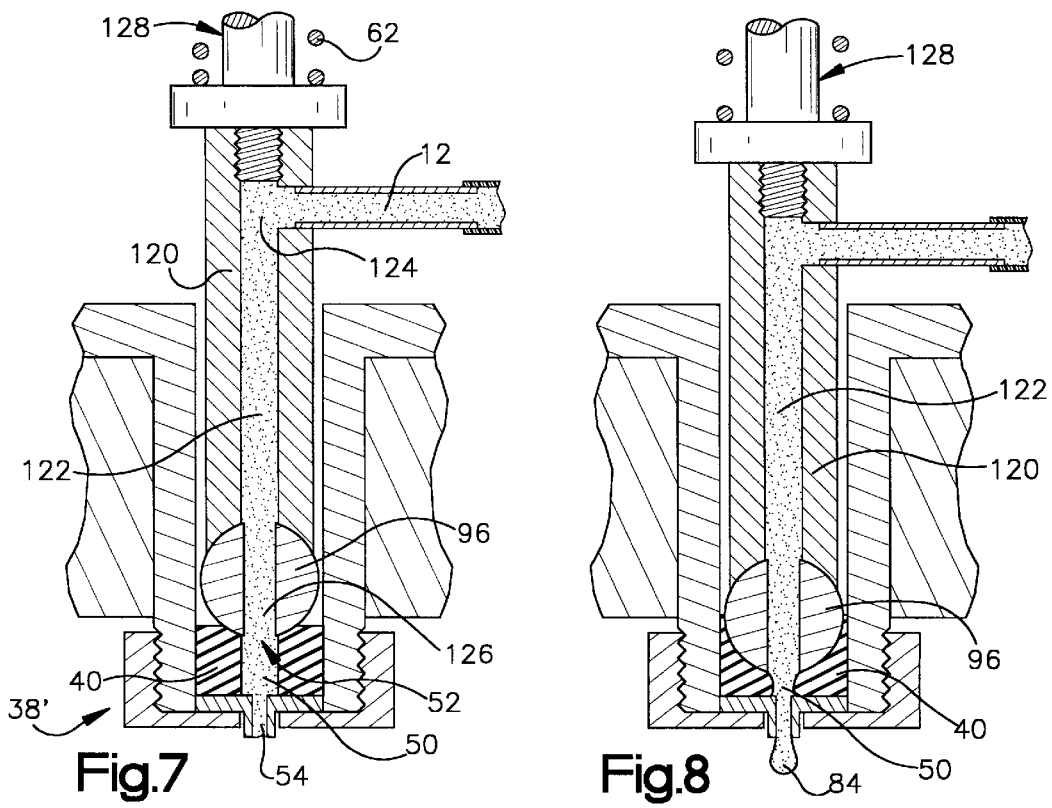
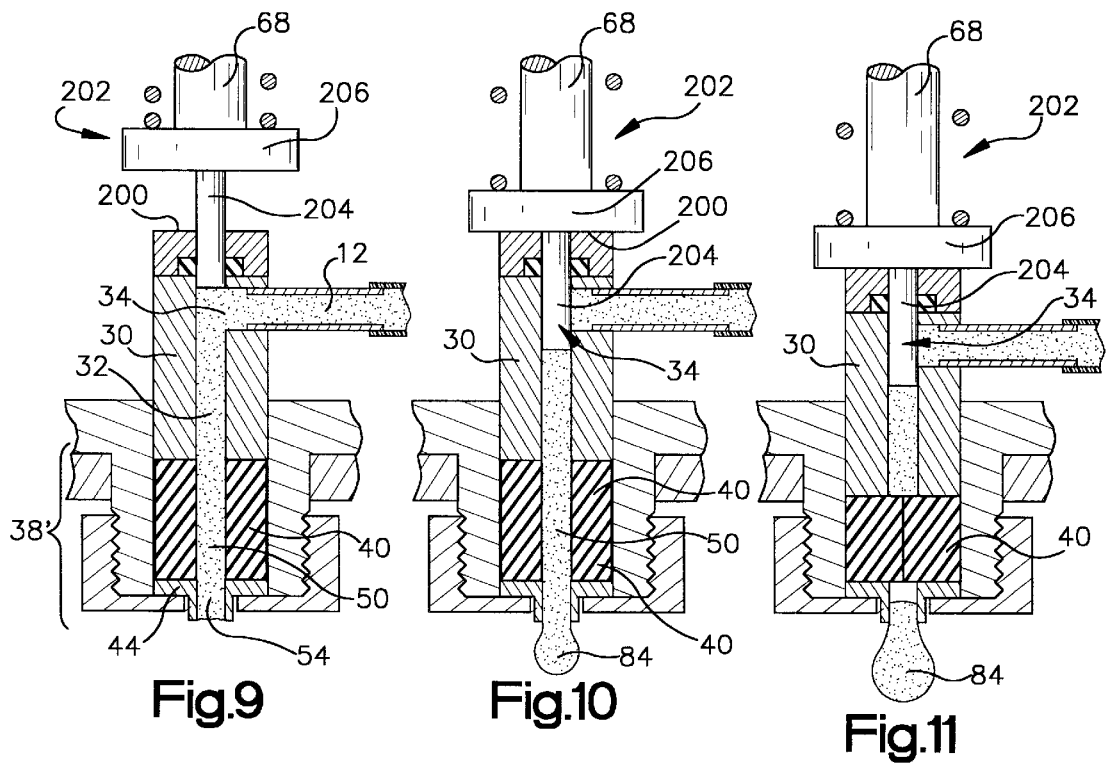

NON-CONTACT LIQUID MATERIAL DISPENSER HAVING A BELLOWS VALVE ASSEMBLY AND METHOD FOR EJECTING LIQUID MATERIAL ONTO A SUBSTRATE

This application is a continuation-in-part of Ser. No. 09/070,946, filed May 1, 1998 which is a continuation-in-part of Ser. No. 08/682,160 filed Jul. 17, 1996 (now U.S. Pat. No. 5,747,102) which is a continuation-in-part of Ser. No. 08/607,126 filed Feb. 26, 1996 (now abandoned), which is a continuation-in-part of Ser. No. 08/559,332 filed Nov. 16, 1995 (now abandoned), then entire disclosures of which are all incorporated herein by reference.

FIELD OF THE INVENTION

The present invention is directed to an apparatus and method for dispensing liquid material, and more particularly, to a non-contact dispenser or applicator having a valve assembly for ejecting liquid material onto a substrate wherein the valve assembly includes a compressible dispensing element.

BACKGROUND OF THE INVENTION

It is often desired to dispense a small amount of material to a precise location, such as when dispensing liquid material including solder fluxes and adhesive materials during the fabrication of a printed circuit board. Throughout this application the term "liquid material" or "material" is intended to mean any substance including but not limited to semisolid or highly filled materials such as adhesives and coatings having by volume or weight fifty percent (50%) or above solids, epoxy, silver filled solder paste, thermogreases, etc., and low viscosity materials such as adhesives and coatings having by volume or by weight below fifty percent (50%) solids, solder flux, etc. Contact type dispensers are often used for such applications. These contact type dispensers use syringes with a tip usually located very close to the substrate; i.e. from about 0.005 inches to 0.060 inches away. The liquid material is held within the syringe and is pushed out of the syringe tip. The liquid material contacts the substrate while it is still in contact with the syringe tip. After the liquid material contacts the substrate, the syringe tip is pulled back from the substrate, thereby drawing out a string of material. Upon sufficient retraction of the syringe, the string is broken and the liquid material forms a droplet on the substrate. One problem with the contact type dispenser is that it requires significant movement of the dispenser away from the substrate to separate the liquid material from the syringe, thereby adding to the time and complexity of the dispensing operation. Another problem with the contact type dispensers is that the string of liquid material can break in a manner such that material ends up on the dispenser instead of the substrate or the droplet does not comprise all the dispensed liquid material, but rather a portion of the material separates from the droplet and lands at an undesignated portion of the substrate.

Non-contact dispensers have been developed to overcome the problems associated with the contact type dispenser. In known non-contact type dispensers a reciprocal plunger or piston engages a valve seat that is immersed in the liquid material to be dispensed. In order to dispense a droplet, the plunger is retracted from the valve seat, allowing the liquid material to flow into the area surrounding the valve seat and into an orifice formed in the seat. The plunger is then urged downward into contact with the seat, thereby forcing the liquid material through the orifice. The plunger is accelerated toward the seat to impart sufficient kinetic energy such that a droplet of the liquid material is formed. The droplet breaks away from the end of the dispenser and is propelled downward toward the substrate.

Specific problems arise when dispensing liquid material from known non-contact dispensers. For example, if solder paste is used, the repeated impact of a plunger against the valve seat compacts and "flattens" the solder balls in the paste. The flattened or deformed solder balls cluster and conglomerate, and block or impair the flow of material through the dispenser. In addition, the surface-to-surface contact between the plunger and the seat, when the contacting surfaces are surrounded by solder paste, creates wear due to the abrasive characteristic of the solder paste. Accordingly, it would be desirable to have a non-contact liquid material dispenser which does not cause the liquid material being dispensed to cluster and block the flow of the liquid material and which does not have an abrasive action between the plunger and valve.

SUMMARY OF THE INVENTION

The present invention is a dispenser or applicator having a bellows valve assembly and method for applying liquid material to a substrate which overcomes the deficiencies of the known dispensers. In the preferred embodiment, the invention is described as a dispenser for ejecting small amounts of material onto a printed circuit board. An exemplary material dispensed from the apparatus is solder paste. However, it should be understood that while the present invention is particularly useful and described herein with reference to dispensing small amounts of solder paste material, the invention is applicable to the dispensing of any liquid material in any amount onto any substrate or other surface.

The dispenser comprises in one embodiment a housing, a force applying element or piston positioned within the housing and having a central or flow bore formed therein, and a valve assembly positioned below and in liquid material communication with the piston. In the preferred embodiment, the valve assembly comprises an upper plate, a resilient and compressible core dispensing element and a nozzle. Herein, the valve assembly with a compressible dispensing element is referred to as a bellows valve because the compressible dispensing element is preferably axially compressed to cause a radial stricture or closure of a liquid passageway there through. Material to be dispensed is drawn or forced into the liquid passageway in the compressible element and forced out through the nozzle by closure or compression of the core element. It is further within the scope of the invention to provide a compressible dispensing element that is axially compressed and in effect thereby radially compressed due to constrained movement, caused by an associated housing that surrounds the compressible dispensing element, to close the liquid passageway there through.

The bellows valve assembly in the preferred embodiment includes three elements: a compressible core dispensing element, an upper or backing plate, and a nozzle. These three parts of the bellows valve are preferably adhered together by any process such as a vulcanized metal to rubber process well known to those of ordinary skill in the art. The bellows valve assembly is positioned partially within the housing below the piston and may have at least a portion of the nozzle extending beyond the housing. The bellows valve assembly has a bore in liquid communication with the central bore of the piston. The liquid material to be ejected flows through the central bore of the force-applying piston and is fed directly to the bellows valve assembly. The piston is reciprocated to selectively apply a force and remove the force from the bellows valve assembly which causes an amount of the liquid material to be dispensed. The upper plate of the bellows valve assembly remains in contact with the piston during operation to prevent the liquid material being dispensed from getting between the piston and the upper plate. In this manner, the liquid material being dispensed does not accumulate or pack between the piston and the bellows valve assembly.

In accordance with another aspect of the invention, the nozzle has a central liquid passage or orifice of diameter "'d", the compressible dispensing element has a central bore of diameter "c", the piston has a restricted portion of a central bore of diameter "b" and a main portion of the bore having a diameter "a". In accordance with one aspect of the invention, the relationships $b \leq c$ and $b \leq d$ are preferably used to reduce back flow of the liquid when the bellows valve is closed. This is useful, for example, when the liquid material is solder paste or other materials having similar characteristics of solder paste. For such liquid materials such as solder paste, it may also be desirable to use the relationship $d \geq c$. However, the relationship $d < c$ may be useful for some liquid materials such as adhesives and other materials having similar characteristics of adhesives. The specific relationship used for any particular application will be defined in part, therefore, by the type of material being dispensed. In most cases, "a" is the largest bore dimension of the piston, valve and nozzle bores, with "b" representing a restricted flow bore between the main piston bore and the bellows valve assembly. Preferably, upon complete assembly the restricted bore is positioned within the bellows valve assembly although this is not required.

In accordance with another aspect of the invention, the bellows valve assembly is an integral structure that easily and conveniently can be removed and replaced as part of routine maintenance of the dispenser. The various aspects and features of the bellows valve assembly thus can find application and utility with other dispenser designs in addition to the specific dispenser examples in this disclosure, as will be readily apparent to those of ordinary skill in the art.

In the preferred embodiment, a heater block is positioned about at least part of the central bore to maintain the solder paste at a temperature conducive to dispensing. It should be apparent to one of ordinary skill in the field that if the liquid material being dispensed does not have to be at a temperature above ambient to maintain a viscosity suitable for dispensing, then the heater can be removed. The flow bore of the piston has an inlet connected to a source of the solder paste material. The bellows valve assembly has a top, a generally circular outer wall and a passage or bore from the top surface to the orifice of the nozzle. In the preferred embodiment, the resilient and compressible core element is generally cylindrical in shape, but any geometric shape capable of performing the function described herein can be used. The passage or bore has a receiving orifice in the upper plate in liquid communication with the flow bore, a central portion extending through the upper plate and the core element to the orifice of the nozzle. A restriction element or tube having a central bore connects the flow bore of the piston to the receiving orifice of the upper plate. In the preferred embodiment, the internal diameter of the central bore of the restriction tube is less than the internal diameter of the central bore of the piston and less than the internal diameter of the central passage of the bellows valve assembly. The nozzle has a central liquid passage or orifice that is preferably equal to the diameter of the central portion of the passage and is in liquid communication therewith for guiding the flow of liquid material onto the substrate or surface.

In operation the passage is filled with solder paste and the piston applies a force to the upper plate of the bellows valve assembly in the direction of the longitudinal axis. Due to the applied force the resilient and compressible core element is axially compressed, causing the outer surface of the core element to press against the housing and the central passage to close thereby forcing at least a portion of the solder paste in the passage (a droplet of solder paste) to be ejected from the outlet. The nozzle guides the solder paste material ejected from the passage onto an appropriate surface or substrate. In the present invention, the force applying piston is maintained in contact with the upper plate of the bellows valve assembly. Thus the solder paste material cannot be trapped between the piston and the upper plate and accordingly the abrasion and wear found in known dispensers is eliminated.

Various other embodiments of the invention are described and claimed herein, and other features and advantages of the present device will become apparent from the following detailed description, with reference to the accompanying drawings and claims, which form a part of the specification.

BRIEF DESCRIPTION OF THE DRAWINGS

FIGS. 2 through 5 are detailed cross sectional views of the housing and bellows valve assembly of FIG. 1 illustrating the sequence of operations for dispensing a droplet of liquid material;

FIG. 7 is a detailed cross sectional view of an alternate embodiment of the dispenser of the present invention, shown in the rest position;

FIG. 8 is a detailed cross section view of the dispenser of FIG. 7, shown in the dispensing position;

FIG. 9 is a detailed cross sectional view of another alternate embodiment of the dispenser of the present invention, shown in the rest position;

FIG. 10 is a detailed cross section view of the dispenser of FIG. 8, shown in an intermediate position; and FIG. 11 is a detailed cross section view of the dispenser of FIG. 8, shown in the dispensing position.

DETAILED DESCRIPTION

Figure 1:
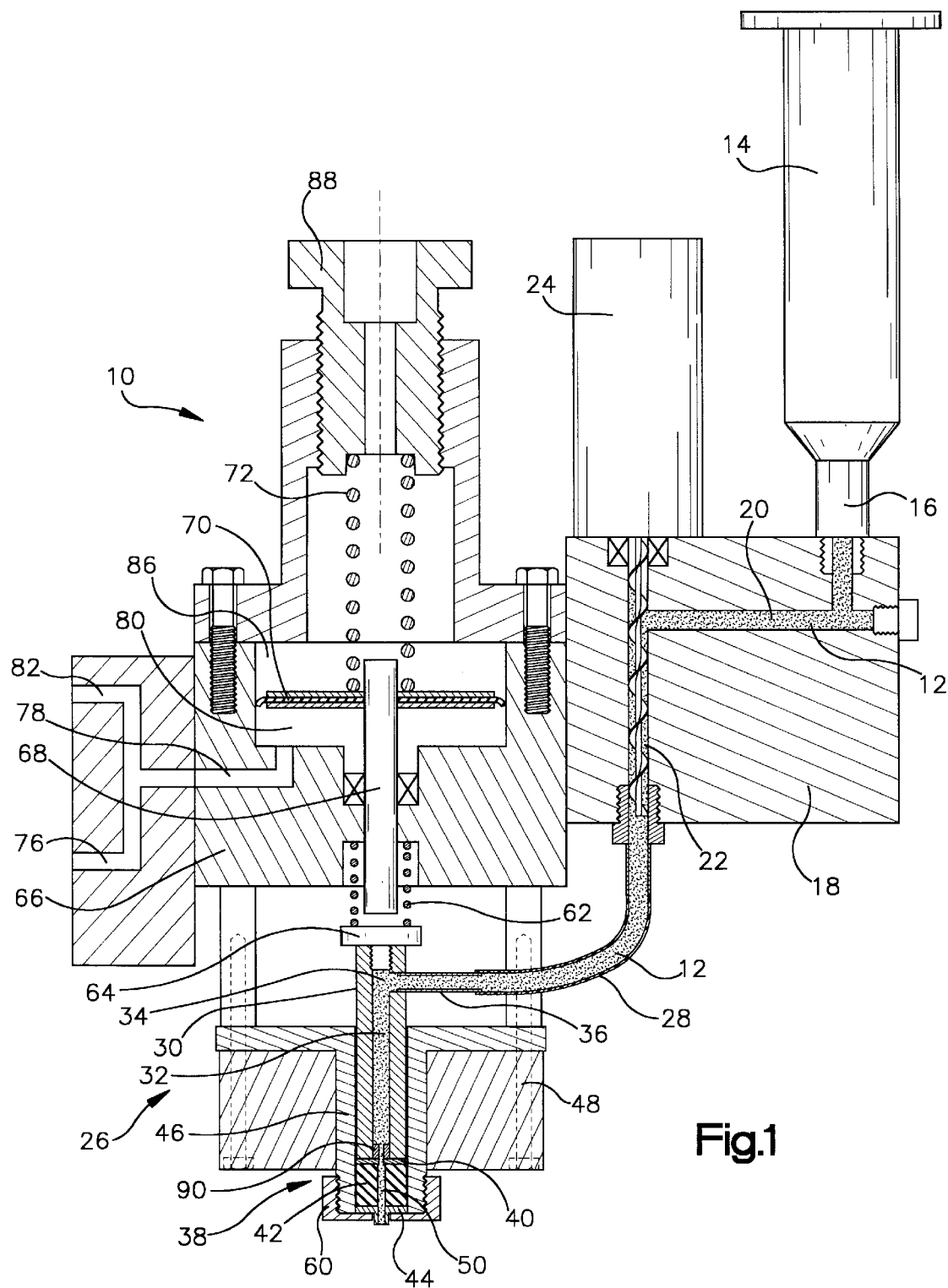
FIG. 1 is a cross sectional view of a preferred embodiment of the dispenser of the present invention.

As shown in FIG. 1, the present invention is a dispenser 10 for applying a liquid material 12 onto a substrate (not shown). In the preferred embodiment, the dispenser 10 comprises a syringe 14 for supplying, under pressure, the liquid material 12 to be dispensed. Of course, any type of liquid material storage and delivery device could be used in place of the syringe 14. Throughout this application, the term "liquid material" or "material" is intended to mean any substance that may be suitably received in and expelled by the dispenser, including but not limited to semisolid or highly filled materials such as adhesives and coatings having by volume or weight fifty percent (50%) or above solids, epoxy, silver filled, solder paste, thermogreases, etc. and low viscosity materials such as adhesives and coatings having by volume or weight below fifty percent (50%) solids, solder flux, etc. The preferred embodiment is described herein with reference to dispensing small amounts of solder paste (i.e. solder balls carried in a flux solution) onto a printed circuit board. The liquid solder paste in the syringe 14 preferably has a viscosity of between about 2,000 to about 1,000,000 centipoise depending on shear rate, and is under pressure to force the liquid material 12 out of the syringe 14. In this example, the solder paste is a power law material, meaning that the viscosity decreases with increasing shear rate. However, the invention is applicable to the dispensing of any liquid material in any amount onto any surface or substrate. For example, the invention can be used with dilatent materials such as conformal coatings, that are characterized by a viscosity that increases with increasing shear rate; and Newtonian materials characterized by a viscosity that is constant with shear rate; and with materials that exhibit a combination of such viscosity properties, for example, materials that are change from power law to Newtonian viscosity characteristics as shear rate increases.

The syringe output portion 16 is threadedly received in a mixer block 18, and is in liquid communication with a conduit 20 formed in the mixer block 18.

In the preferred embodiment, a mixer 22 is disposed in a vertical portion of the conduit 18. The mixer 22 is a spiral-type having nylon bristles about its outer surface, but it should be understood that any type of mixer 22 capable of maintaining the proper consistency of the material 12 may be used without departing from the scope of the present invention. The mixer 22 is coupled to the mixer drive 24 for rotating the auger within the conduit 20. It should be understood that the mixer 22 and associated components may be omitted if the material 12 does not have to be mixed to maintain the proper consistency or viscosity, in which case the syringe 14 is coupled directly to a lower housing 26.

In the preferred embodiment the mixer block 18 is connected to the lower housing 26 by a flexible tube 28, and the flexible tube 28 is in liquid communication with a piston 30 having a flow or central bore 32 formed therein. The piston 30 is positioned within the lower housing 26 and material 12 enters the piston 30 at an inlet 34 of the flow bore 32, and a generally rigid conduit 36 is used to couple the flexible tube 28 to the inlet 34.

A bellows valve assembly 38 comprises an upper or pressure plate 40, a resilient and compressible core element 42 and a nozzle 44. In the preferred embodiment the core element 42 is generally cylindrical in shape, however, other geometric configurations may be used as required. The bellows valve assembly 38 is positioned below the piston 30 and partially within the housing 26 with the nozzle 44 extending beyond the housing 26. A sleeve 46 forms a portion of the lower housing 26. The piston 30 and a portion of the bellows valve assembly 38 are closely received in the sleeve 46. FIGS. 1–5 illustrate one embodiment of the bellows valve assembly 38 with a simplified view for clarity and ease of illustration of the overall dispenser system. A more detailed illustration of the preferred embodiment of the bellows valve assembly 38 is provided in FIG. 6A.

A heating block 48 is positioned around the sleeve 46 and a heating element (not shown) is thermally coupled to the heating block 48 to heat at least part of the lower housing 26 such that the material in the flow bore 32 and/or bellows valve assembly 38 is properly heated to achieve the desired viscosity for dispensing. The heating block 48 is preferably formed of a heat conducting material, such as aluminum, and the material may be heated to a temperature of, for example, 22° C. to about 75° C., preferably between about 40° C. and 65° C. Of course, it should be understood that the heating block 48 and associated components may be omitted if the material 12 does not have to be heated to maintain the desired consistency or viscosity.

The bellows valve assembly 38 has a central flow passage or bore 50 formed therein (FIG. 3), the passage 50 having a receiving inlet 52 and a discharge outlet 54 and a central portion 56 connecting the receiving inlet 52 and discharge outlet 54. The outlet 58 of the piston flow bore 32 is in liquid communication with the inlet 52 of bellows valve assembly 38. The upper or backing plate 40, resilient and compressible core element 42 and nozzle 44 are adhered by any process such as a vulcanized metal to rubber process well known in the field, and the integral bellows valve assembly 38 is held in place by a nut 60 threadedly attached to the sleeve 46. Other arrangements, such as forming extensions in the bellows valve assembly 38 that are received by cut-outs in the piston 30 or nozzle 44, for example, may be used to couple the bellows valve assembly 38 to the piston 30 and will be readily apparent to those skilled in the art.

The operation of the dispenser 10, and in particular the positions of the piston 30 and bellows valve assembly 38 is shown in FIGS. 2–5, and is discussed in greater detail below.

As best shown in FIGS. 2–3, the bellows valve assembly 38 flow bore 50 formed therein has a longitudinal axis A—A. The passage 50 receives the material 12. The core element 42 is formed from any resilient or compressible material, such as an elastomer, neoprene, urethane, rubber, or polyisoprene. As noted above, the piston 30 is positioned above the bellows valve assembly 38, and in the preferred embodiment remains in contact with the upper plate 40. In operation, the piston 30 applies a generally uniform axial force to the top surface of the upper plate 40. A compression spring 62 is located between a force receiving element, or anvil, 64 and the block 66 (FIG. 1). This spring maintains the piston 30 lower end in contact with the upper plate 40 during operation of the dispenser.

Upon the application of a downward force on the upper plate 40 via a hammer shaft 68 and the anvil 64, generally in the direction of the longitudinal axis A—A of passage 50, the core element 42 is axially compressed. The outer surface or wall of the core element 42 is constrained by and pressed against the sleeve 46, forcing the walls of the passage 50 to converge and close the passage 50, thereby blocking the flow of material 12 into the passage 50 and forcing at least some of the material within the passage 50 out of the outlet 54. The piston 30, through force applied by a piston spring 72 to the hammer shaft 68 via an actuator piston 70, is biased to apply a force to the bellows valve assembly 38 that is sufficient to maintain the bellows valve assembly 38 in the closed position shown in FIG. 2. The outer surface of the bellows valve assembly 38 is constrained by the sleeve 46 from significant expansion in a direction generally perpendicular to the force applied by the piston 30. The nozzle 44 opposes the force applied by the piston 30 to limit the compression of the core element 42 in the direction of the applied force. Preferably, the compressive forces applied to the core element 42 to close the bellows valve 38 are limited to assure that the core element 42 remains in an elastic condition and does not undergo plastic deformation as defined by Young's modulus of elasticity for the selected material of the core element 42.

When the bellows valve assembly 38 is in the closed position (FIG. 2), the actuator piston 70 (FIG. 1) is in its lower position (not shown). The piston spring 72 applies a force to the actuator piston 70, and the hammer shaft 68 is rigidly attached to the piston 70. The hammer shaft 68 is thereby urged into contact with the anvil 64 that is threadedly received in the piston 30 (FIG. 2). The force applied by the hammer shaft 68 and transmitted by the piston 30 to the upper plate 40 keeps the bellows valve assembly 38 in the closed position in the absence of actuation pressure applied to the piston 70. The piston 30 preferably applies a generally uniform force across the top surface of the upper plate 40.

When it is desired to dispense a droplet of liquid material, air is routed through an inlet air path 76 (FIG. 1), through a common path 78 in the block 66, into a lower air chamber 80. The air pressure in the lower air chamber 80 overcomes the force of the piston spring 72, and moves the air piston 70 upwardly. The shaft 68 is thus lifted off of the anvil 64, thereby removing the axial compressive force applied on the bellows valve assembly 38. As this force is removed, the bellows valve assembly 38 returns to its uncompressed shape and the walls of the passage 50 diverge, which opens the passage 50 into which the material 12 flows. The bellows valve assembly 38 is shown in its open state in FIGS. 1 and 3. Once the dispenser 10 is in the open position, the material 12 enters the passage 50 of the bellows valve assembly 38. The force is removed from the upper plate 40 for a predetermined amount of time to allow a predetermined amount of material 12 to enter the inlet 52 of the passage 50. Once sufficient time has passed and it is desired to dispense the material 12, the flow of compressed air to the inlet air path 76 is terminated. This causes the piston spring 72 to urge the air piston 70 and shaft 68 downward into contact with the anvil 64. During the downward stroke, air is exhausted through the common path 78 and an exhaust path 82 (FIG. 1). The force of the compression spring 72 is once again transmitted to the piston 30 and bellows valve assembly 38, thereby causing the walls of the passage 50 to converge (FIG. 4). As shown in FIG. 1, a threaded cap 88 may be used to vary the force applied by the actuator piston spring 72.

As the walls of the passage 50 converge, material 12 that is contained in the passage 50 is urged out of the bellows valve assembly 38. Part of the material in the passage 50 is expelled upwardly back into the flow bore 32, and the remaining material is expelled downwardly through the nozzle 44. Provision of a restricted diameter bore as will be described herein after helps reduce the amount of material that back flows into the bore 32 during a dispensing step. Additionally, in a preferred embodiment, the walls of the passage 50 remain generally parallel as they converge, as best shown in FIGS. 3–4. In this manner, the passage 50 maintains a generally uniform width as the walls of the passage converge in response to the application of an axial force.

As the walls of the passage 50 converge, a droplet 84 of material is formed and ejected from the nozzle 44 (FIGS. 4–5). The convergence of the passage walls is preferably fast enough to form a droplet 84 which separates from the dispenser 10, thereby expelling the droplet 84 from the dispenser 10. This "shooting" action avoids having the nozzle 44 make contact with the surface upon which the material 12 is to be dispensed. Furthermore, the dispensed droplet does not make contact with the substrate and the nozzle 44 at the same time, thereby providing a clean non-contact dispensing operation. Since the substrate need not be moved into contact with the dispenser and pulled away to form a "string", movement of the substrate in the vertical direction is eliminated.

A restriction device or tube 90 is disposed in the flow bore 32 near the outlet 58 of the flow bore immediately upstream of the bellows valve assembly 38. The restriction tube 90 in the flow bore 32 forms a primary restricted orifice 52 for the material 12 flowing through the flow bore 32. Similarly, the nozzle 44 forms a secondary restricted orifice 54 as material 12 exits the dispensing element 40. In the preferred embodiment the internal diameter "b" of the restriction tube 90 is less than the internal diameter "a" of the flow bore 32 and less than or equal to the internal diameter "c" of the passage 50 while the nozzle orifice 54 is the same size "d" as the central portion 56 of the passage 50. In an exemplary embodiment, the flow passage 50 is a nominal diameter of 0.020 inches, the nozzle orifice 54 is 0.020 inches and the restricted orifice 52 is 0.020 inches. The flow passage through the restriction device may be, for example, 0.030 inches. The primary and secondary orifices combine to provide a degree of control. Thus in the exemplary preferred embodiment, the restricted orifice is about 0.010 inches less that the diameter of the flow passage through the compressible element 42 and the nozzle 44. The primary and secondary orifices 52, 54 combine to provide a degree of control, as the orifices may be varied to change the flow rate of material through the dispenser. For example, to reduce the flow rate of the material, a restriction tube 90 and nozzle 44 having smaller inner diameters are used.

As further shown in FIG. 5, the passage 50 is closed completely and all of the material contained in the bellows valve assembly 38 is expelled, with a portion being ejected through the nozzle 44 and a portion being forced back into the chamber 32 through the restricted orifice 52. This substantially complete purging of the bellows valve assembly 38 ensures that there are no dead spots within the bellows valve assembly 38; that is, there are no pockets of stagnant flow within the bellows valve assembly 38. Furthermore, when solder paste is used, the core element 42 does not deform the solder paste balls contained in the solution, due to the fact that there is a substantially complete purging of material. Because the material is substantially completely purged there is no material to be trapped within the dispensing element as it moves to the closed position. This is desirable because under the prior art, when solder paste was trapped it could deform the solder balls and lead to clumping of solder balls within the paste.

Furthermore, even if there were not a complete purging of material and some material did happen to be trapped within the dispensing element as it moves to the closed position, the core element 42 is generally resilient and thus would not deform the solder balls in the trapped material. The core element 42 would instead conform around the trapped material. Thus, the shape or morphology of the solder paste is not changed by the core element 42, which avoids the formation of clumps or clusters of solder balls within the paste. Furthermore, the present invention provides a flexible-material to flexible-material seal, due to the fact that the seal is provided by the closure of the walls of the passage. The walls of the passage are flexible, and therefore provide a more durable, longer lasting seal than a metal-to-metal seal. Finally, a further advantage in the present invention is that any material that is left on the nozzle 44 after the droplet 84 is dispensed is retracted or "sucked back" into the dispensing element when it moves to the open position. The retracted portion of the material can then be properly expelled during the next cycle.

The piston 30 is maintained in contact with the upper plate 40 by operation of the bias spring 62 during the reciprocation of the piston 30. In this manner, no gap exists between the piston and the upper plate 40 in which the material may collect. In the prior art dispensers, material may be trapped between a force applying element and a seat, which may deform the solder balls and lead to clogging. By maintaining contact between the piston 30 and upper plate 40, an area of contact is eliminated, and the opportunity for deforming solder balls correspondingly reduced.

Figure 6A:
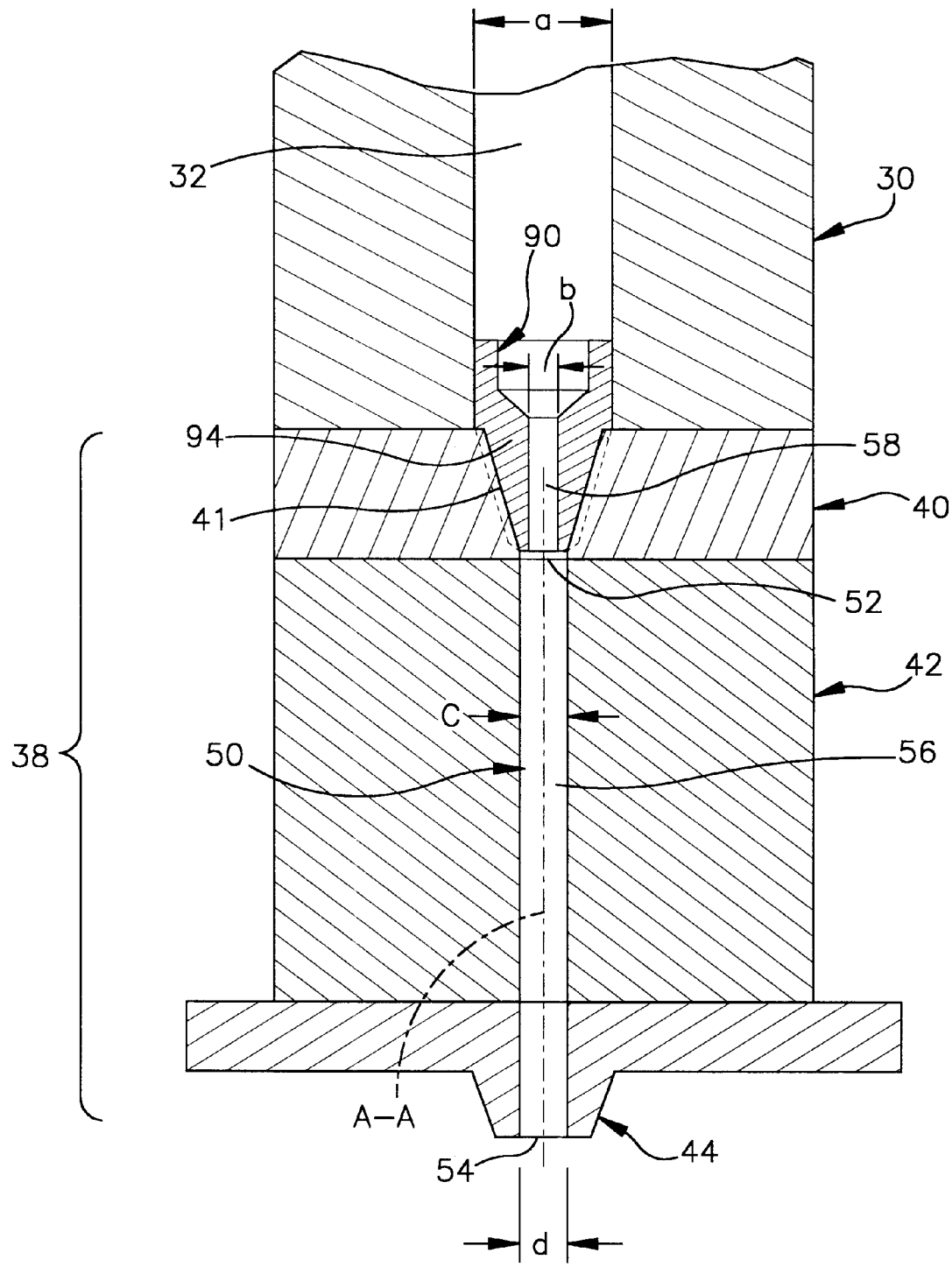
FIG. 6A is a detailed cross section view of a preferred embodiment of a restriction tube and integrally assembled bellows valve assembly.

FIG. 6A shows the preferred bellows valve assembly 38. For clarity and ease of illustration, FIG. 6A illustrates only the bellows valve assembly and the lower end of the piston 30 (the housing 26, the sleeve 46 and the block 48 are omitted in FIG. 6A). The bellows valve 38 has the inlet 52 of the passage 50 in the upper plate 40 inwardly chamfered as at 41. The restriction tube 90 has a protruding nose portion 94 that is received in the chamfered inlet 52 when assembly is complete. The intersection between inlet 52 and the protruding portion 94 assures that the central bore in the piston 30 and the central bore in the core element 42 are radially aligned. In other words, the protrusion 94 acts as a pilot to align the flow bores 32 and 50. Preferably the restriction tube 90 is glued or otherwise secured within the piston bore 32. The upper plate 40 may be made of any suitable material that can withstand the impact of the piston 32 and distribute the force relatively uniformly across the upper surface of the core element 42, such as, for example, metal, plastic, nylon and so forth. The upper plate 40, the compressible element 42 and the nozzle 44 are adhered so as to form a unitary or integrated assembly that can be easily removed and replaced for maintenance.

Figure 6B:
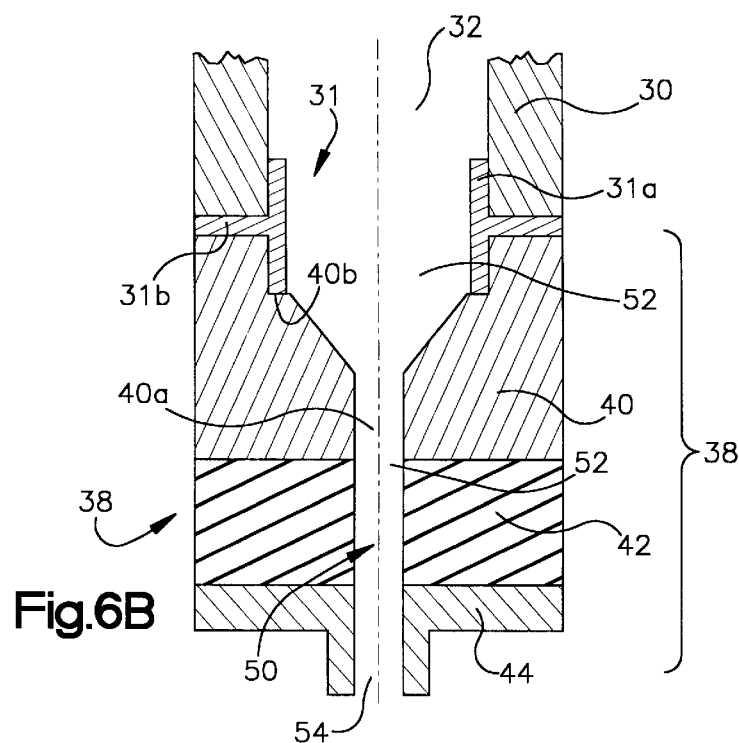
FIG. 6B is a detailed cross section of an alternative embodiment of the restriction tube and the bellows valve assembly.

FIG. 6B illustrates an alternative embodiment of the bellows valve assembly 38. In this embodiment, the upper plate 40 has a tapered bore therein that forms a restriction passage or bore 40*a* that opens to and is aligned with the inlet 52 of the compressible core element 42. In this embodiment, since the restricted passage is formed in the upper plate 40, the restriction tube 90 is replaced with an alignment element 31. The alignment element 31 has a cylindrical body 31*a* and a centrally disposed outer circumferential flange 31*b*. The alignment element 31 slips onto the lower end of the piston 30 and preferably is securely adhered thereto. The lower end of the alignment element 31 fits snugly into and bottoms on a counterbore 40*b* formed in an upper portion of the upper plate 40. Thus the flange 31*b* is sandwiched between the piston 30 and the upper plate 40 to maintain proper alignment between the piston 30 and the upper plate 40. The alignment element 31 can also be used to provide a seal function between the piston 30 and the upper place 40. The alignment element 31 is not adhered to the upper plate 40 so as to permit the bellows valve assembly 38 to be removed as an integral unit from the dispenser apparatus.

Figure 6C:
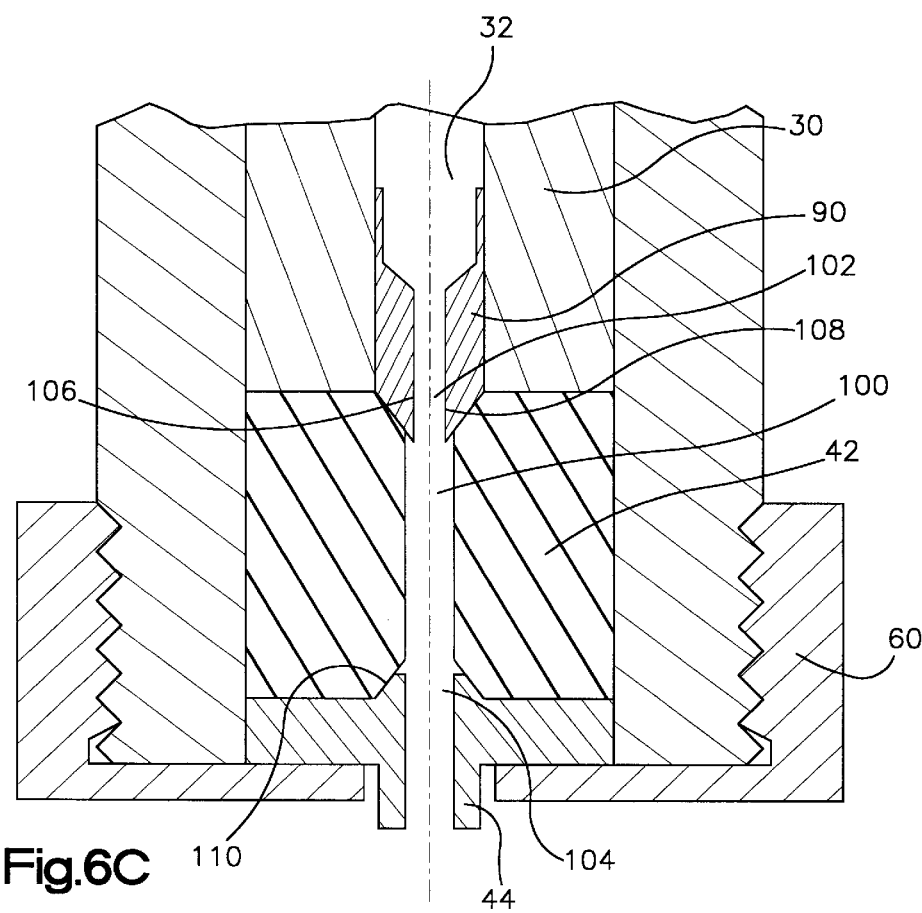
FIG. 6C is a detailed cross section of another alternative embodiment of the restriction tube and the bellows valve assembly.

FIG. 6C shows another alternative embodiment of the bellows valve assembly 38 that does not use the upper plate 40. In this alternative embodiment of the bellows valve assembly 38, the piston 30 directly contacts the core element 42. In contrast to the preferred embodiment in FIG. 6A, the piston 30 is adhered to the top surface of the core element 42 and remains in contact during operation. Alternatively, the piston 30 need not be adhered to the core element 42 but preferably is maintained in contact with the core element 42 by operation of the spring 62. The core element 42 has a central bore or passage 100, an inlet 102 and an outlet 104. The inlet 102 and outlet 104 of the passage 100 are inwardly chamfered. The restriction tube 90 has a slightly protruding portion 106 that is received by the inlet 102 and serves as a pilot for alignment of the flow bores 32 and 100. The protruding portion 106 extends within the central bore 100 so that the internal diameter of the restriction tube 90 is less than the internal diameter of the central bore 100. The nozzle 44 has a slightly protruding portion 110 that is received by the outlet 104. The internal diameter of the central bore 100 preferably is the same as the nozzle internal bore diameter. The interaction between the inlet and outlet orifices 102 and the protruding portion 106 and 110 ensures that the central bores in the piston 30, restriction tube 90, bellows valve assembly 38 and the nozzle 44 are all radially and concentrically aligned. It is also within the scope of the invention to connect the threaded nut 60 and nozzle 44 into a single unitary component for ease of replacement.

In an alternative embodiment to FIG. 6C, the primary orifice (provided by restriction tube 90) and secondary orifice (provided by the nozzle 44) can have the same diameter. In all cases, the flow passages may range, for example, from about 0.010 inches to about 0.10 inches, further preferably about 0.020 inches. The shape of the nozzle 44 may also be varied to accommodate various types of material, and to create material droplets 84 having varying characteristics.

Furthermore, it should be understood that in the alternative embodiments without the upper plate 40, a non-uniform, non-centered force may be applied to the bellows valve assembly 38. For example, a rod or force-applying shaft may contact and axially compress the core element 42 at a non-radially-centered location on the top surface. This force is sufficient to cause the passage 100 in the core element 42 to close and thereby urge material out of the passage 50. However, in the preferred embodiment the force is applied generally uniformly across the top surface of the upper plate 40. This is preferred because it ensures that the walls of the passage converge uniformly, which completely purges all of the material in the passage 50. As noted earlier, this complete purging reduces the chance of any material being trapped by, and therefore deformed by, the core element 42.

An alternate embodiment of the invention is shown in FIGS. 7–8. The dispensing assembly shown therein includes a feed shaft 120 having a flow bore 122 extending therethrough, the flow bore 122 having an inlet 124 and an outlet 126. Force applying element 128 (similar to the hammer 68 of the previous embodiment) selectively applies and removes a force to the feed shaft 120. The outlet 126 of the flow bore 122 is in liquid communication with the inlet of a bellows valve assembly 38', and the feed shaft 120 is preferably spring biased to keep the ball 96 in contact with the core element 42. This arrangement prevents the material 12 from squeezing in between the shaft 120 and core element 42, in which case the solder balls could be deformed by the applied forces. Preferably, the feed shaft 120 has an enlarged nozzle, or ball 96, for seating the shaft 120 against the bellows valve assembly 38', and the ball 96 is preferably generally spherically shaped. Material in the flow bore 122 is fed by an controlled start/stop feed mechanism (not shown) to provide a positive shutoff.

The dispensing apparatus is shown at rest in FIG. 7. In order to dispense the material 12, a force is applied by the force-applying element 74 to the feed shaft 120. The feed shaft 120 is urged downwardly, thereby axially compressing the core element 42, as shown in FIG. 8. The force of the feed shaft 120, as well as the reduced volume in the passage 50, causes a droplet 84 of material to be formed and ejected from the dispenser. Once the droplet 84 is dispensed, the force is removed from the shaft 120, and the shaft 120 and bellows valve assembly 38' return to their original configuration as shown in FIG. 7. The material feed mechanism may supply additional material to the flow bore 122 to replace the dispensed droplet.

Another alternate embodiment is shown in FIGS. 9–11. The dispenser includes a piston 30 having a flow bore 32 and a force receiving surface 200 on one axial end. The dispenser further includes a force-applying element 202 comprising a shaft 204 and a disk 206. The force-applying element 202 may apply and remove a force on the piston 30 in the same manner as described above with the hammer 68, or under any other arrangement for applying and removing a force. During the reciprocation of the force-applying element 202, the shaft 204 reciprocates within the flow bore 32. In order to dispense the material, the shaft 204 and disk 206 are raised such that the force applying element 202 applies a reduced force, or no force, to the piston 30 (FIG. 9). Material 12 then enters the bellows valve assembly 38, and is urged in the passage 30 under pressure by a feed mechanism, such as an auger pump or an air feed. In order to dispense material 12, the force applying element 202 is activated to apply a force to the force-receiving surface 200 (FIG. 10). The applied force is then transmitted through the piston 30 and applied to the bellows valve assembly 38'. In the same manner as described above, the passage walls in the bellows valve assembly 38' converge, thereby expelling material 12 out of the nozzle. Furthermore, when in the dispensing position as shown in FIGS. 10–11 the shaft 204 blocks the liquid inlet 34 in the flow bore 32 so that material 12 is blocked from entering the flow bore 32. The axial movement of the shaft 204 also helps to urge material 12 out of the flow bore 32. Once the force on the bellows valve assembly 38' is removed, the walls of the passage 50 diverge, and the core element 42 returns to the shape shown in FIG. 9.

The above-described invention may be used to effectively dispense small amounts of liquid material. The invention reduces the surface-to-surface engagement to which the liquid is exposed, thereby reducing the opportunities for the formation of clups within the material, and thereby reducing clogging. However, with the present disclosure in mind it is believed that obvious alterations to the preferred embodiments, to achieve comparable features and advantages, will become apparent of ordinary skill in the art.

We claim:

1. An apparatus for dispensing a liquid material onto a substrate comprising:
    a piston having an upper force receiving surface, a lower surface and a flow bore extending therein, said flow bore having an inlet for receiving the liquid material and an outlet;
    a compressible dispensing element having an upper surface being capable of receiving a force from said piston and having a liquid passage extending there through, said liquid passage having a liquid inlet in liquid communication with said outlet of said piston flow bore and a liquid outlet;
    said liquid passage of said dispensing element being capable of at least partially closing to expel at least a portion of the liquid material from said liquid outlet when said lower surface of said piston applies a force sufficient to compress said dispensing element;
    a nozzle in liquid communication with said liquid outlet of said liquid passage for guiding the liquid material expelled from said liquid outlet of said liquid passage towards a substrate; and
    a pressure plate disposed axially between said piston and said compressible dispensing element to apply a substantially uniform force across said dispensing element upper surface.

2. The apparatus of claim 1 comprising a housing that surrounds said compressible dispensing element and constrains the expansion of said dispensing element in a direction generally perpendicular to an applied force when said dispensing element is compressed.

3. The apparatus of claim 2 further comprising a flow restricting element positioned within said flow bore near said outlet of said flow bore.

4. The apparatus of claim 3 wherein said piston is capable of applying a generally uniform compressive force across said dispensing element upper surface.

5. The apparatus of claim 4 wherein said piston lower surface remains in contact with said dispensing element upper surface.

6. The apparatus of claim 5 wherein said pressure plate, dispensing element and nozzle are adhered together as a unitary assembly.

7. The apparatus of claim 2 wherein said piston is capable of applying a generally uniform compressive force across said dispensing element upper surface.

8. The apparatus of claim 7 wherein said piston lower surface remains in contact with said dispensing element upper surface.

9. The apparatus of claim 8 wherein said pressure plate, dispensing element and nozzle are adhered together as a unitary assembly.

10. The apparatus of claim 2 wherein said piston lower surface remains in contact with said dispensing element upper surface.

11. The apparatus of claim 10 wherein said pressure plate, dispensing element and nozzle are adhered together as a unitary assembly.

12. The apparatus of claim 2 wherein said pressure plate, dispensing element and nozzle are adhered together as a unitary assembly.

13. The apparatus of claim 1 further comprising a flow restricting element positioned within said flow bore near said outlet of said flow bore.

14. The apparatus of claim 13 wherein said piston is capable of applying a generally uniform compressive force across said dispensing element upper surface.

15. The apparatus of claim 14 wherein said piston lower surface remains in contact with said dispensing element upper surface.

16. The apparatus of claim 15 wherein said pressure plate, dispensing element and nozzle are adhered together as a unitary assembly.

17. The apparatus of claim 13 wherein said piston lower surface remains in contact with said dispensing element upper surface.

18. The apparatus of claim 17 wherein said pressure plate, dispensing element and nozzle are adhered together as a unitary assembly.

19. The apparatus of claim 13 wherein said pressure plate, dispensing element and nozzle are adhered together as a unitary assembly.

20. The apparatus of claim 1 wherein said piston is capable of applying a generally uniform compressive force across said dispensing element upper surface.

21. The apparatus of claim 20 wherein said piston lower surface remains in contact with said dispensing element upper surface.

22. The apparatus of claim 21 wherein said pressure plate, dispensing element and nozzle are adhered together as a unitary assembly.

23. The apparatus of claim 20 wherein said pressure plate, dispensing element and nozzle are adhered together as a unitary assembly.

24. The apparatus of claim 1 wherein said piston lower surface remains in contact with said dispensing element upper surface.

25. The apparatus of claim 24 wherein said pressure plate, dispensing element and nozzle are adhered together as a unitary assembly.

26. The apparatus of claim 1 wherein said liquid comprises solder paste.

27. The apparatus of claim 1 wherein said pressure plate, compressible element and nozzle are adhered to form a unitary assembly.

28. The apparatus of claim 1 wherein said nozzle has an orifice diameter substantially equal to the diameter of said liquid passage.

29. The apparatus of claim 1 wherein said liquid passage has a diameter between about 0.010 inches and about 0.10 inches.

30. The apparatus of claim 1 wherein said material is a suspension of solder balls in a flux solution.

31. The apparatus of claim 1 wherein said piston blocks the flow of material to said inlet of said flow bore when said piston is applying force to said dispensing element.

32. The apparatus of claim 1 comprising an actuator for applying a force to said piston and wherein said compressible dispensing element remains in an elastic condition during compression.

33. The apparatus of claim 32 wherein said actuator comprises a bias element that maintains said piston in contact with said dispensing element, and further wherein said compressible element elastically returns to its uncompressed state to open said liquid passage.

34. An apparatus for dispensing a liquid material onto a substrate comprising:
  a piston having an upper force receiving surface, a lower surface and a flow bore extending therein, said flow bore having an inlet for receiving the liquid material and an outlet;
  a compressible dispensing element having an upper surface in contact with said lower surface of said piston and having a liquid passage extending there through, said liquid passage having a liquid inlet in liquid communication with said outlet of said piston flow bore and a liquid outlet;
  said liquid passage of said dispensing element being capable of at least partially closing to expel at least a portion of the liquid material from said liquid outlet when said lower surface of said piston applies a force sufficient to compress said dispensing element;
  a nozzle in liquid communication with said liquid outlet of said liquid passage for guiding the liquid material expelled from said liquid outlet of said liquid passage towards a substrate; and
  a pressure plate disposed axially between said piston and said compressible dispensing element for applying the compressive force from said piston substantially uniformly across said upper surface of said compressible dispensing element;
  wherein said pressure plate, dispensing element and nozzle are adhered together as a unitary assembly.

35. An apparatus for dispensing liquid material onto a substrate comprising:
  a compressible dispensing element having a passage formed therein with an inlet to receive the material and an outlet to discharge at least a portion of the material;
  a piston having a flow bore in liquid communication with said passage inlet, said piston capable of applying a force to compress said dispensing element causing the walls of said passage to converge and expel material contained in said passage through said outlet; and
  a nozzle in liquid communication with said outlet for guiding the material ejected from said outlet onto the substrate.

36. Apparatus for dispensing liquid material onto a substrate comprising:
  a piston for applying a force and a liquid bore therein having an outlet;
  a compressible dispensing element having a liquid passage formed therein with an inlet to receive the material from said piston bore outlet and an outlet to discharge at least a portion of the material;
  said piston capable of applying a force to compress said dispensing element causing the walls of said passage to converge and expel at least a portion of said material contained in said passage through said outlet; and
  a nozzle in liquid communication with said dispensing element outlet for guiding the material ejected from said outlet onto the substrate.

37. The apparatus of claim 36 comprising a pressure plate disposed axially between said piston and said compressible dispensing element to apply a substantially uniform force across said dispensing element upper surface.

38. The apparatus of claim 37 wherein said pressure plate, dispensing element and nozzle are adhered together as a unitary assembly.

39. A bellows valve assembly for dispensing liquid material onto a surface, comprising:
  a pressure plate having a bottom surface;
  a compressible dispensing element having a lower surface and an upper surface adjacent said pressure plate bottom surface; and
  a nozzle adjacent said dispensing element lower surface;
  said pressure plate, dispensing element and nozzle each having a respective bore therethrough that when assembled define a liquid passage through which material is dispensed when a force is applied to said pressure plate;
  said dispensing element being compressed between said pressure plate and said nozzle, when a force is applied to said pressure plate, to at least partially close said liquid passage to eject material from said nozzle.

40. The apparatus of claim 39 wherein said pressure plate, dispensing element and nozzle are adhered together as a unitary assembly.

41. The apparatus of claim 39 comprising a housing that encloses said dispensing element to constrain radial expansion of said element so that an axial compressive force applied to said dispensing element causes said flow passage through said dispensing element to at least partially close.

42. The apparatus of claim 39 wherein said dispensing element flow passage closes at least part way under an applied force; said element remaining in an elastic condition so that said passage opens upon removal of said force.

43. A method for ejecting a liquid material from a dispenser having a compressible dispensing element with a passage formed therein, the passage having an inlet and outlet, the dispenser also having a piston positioned above the dispensing element, the method comprising the steps of:
  supplying the liquid material to the inlet of the passage;
  at least partially filling the passage with the liquid material;
  applying a compressive force to the dispensing element from the piston;
  maintaining contact between the piston and the dispensing element;

at least partially closing the passage in the dispensing element;

ejecting at least a portion of the liquid material from the outlet of the passage;

at least partially reducing said compressive force to refill the passage with the liquid material while maintaining contact between the piston and the dispensing element.

44. The method of claim 43 wherein the step of applying a compressive force includes the step of applying a compressive force uniformly across a surface of the dispensing element.

45. The method of claim 43 wherein the step of applying a compressive force comprises the steps of applying an axial force to the dispensing element and radially constraining the dispensing element.

46. The method of claim 43 including the step of restricting flow of the material from a source passage to said dispensing element inlet.

47. A bellows valve assembly for dispensing liquid material onto a surface, comprising:

a pressure plate having a bottom surface;

a compressible dispensing element having a lower surface and an upper surface adjacent said pressure plate bottom surface; and a nozzle adjacent said dispensing element lower surface;

said pressure plate, dispensing element and nozzle defining a liquid passage through which material is dispensed when a force is applied to said pressure plate;

said dispensing element being compressed between said pressure plate and said nozzle, when a force is applied to said pressure plate, to at least partially close said liquid passage to eject material from said nozzle;

wherein said pressure plate, dispensing element and nozzle are adhered together as a unitary assembly.

48. A bellows valve assembly for dispensing liquid material onto a surface, comprising:

a pressure plate having a bottom surface;

a compressible dispensing element having a lower surface and an upper surface adjacent said pressure plate bottom surface; and a nozzle adjacent said dispensing element lower surface;

each of said pressure plate, compressible element and nozzle having a respective bore for the material to flow through;

said pressure plate, dispensing element and nozzle when assembled defining a liquid passage through which material is dispensed when a force is applied to said pressure plate;

said dispensing element being compressed between said pressure plate and said nozzle, when a force is applied to said pressure plate, to at least partially close said liquid passage to eject material from said nozzle; and a housing that encloses said dispensing to constrain radial expansion of said element so that an axial compressive force applied to said dispensing element causes said flow passage through said dispensing element to at least partially close.

49. A bellows valve assembly for dispensing liquid material onto a surface, comprising:

a pressure plate having a bottom surface;

a compressible dispensing element having a lower surface and an upper surface adjacent said pressure plate bottom surface; and a nozzle adjacent said dispensing element lower surface;

each of said pressure plate, compressible element and nozzle having a respective bore for the material to flow through;

said pressure plate, dispensing element and nozzle when assembled defining a liquid passage through which material is dispensed when a force is applied to said pressure plate;

said dispensing element being compressed between said pressure plate and said nozzle, when a force is applied to said pressure plate, to at least partially close said liquid passage to eject material from said nozzle; and wherein said dispensing element flow passage closes at least part way under an applied force; said element remaining in an elastic condition so that said passage opens upon removal of said force.

50. An apparatus for dispensing a liquid material onto a substrate comprising:

a piston having an upper force receiving surface, a lower surface and a flow bore extending therein, said flow bore having an inlet for receiving the liquid material and an outlet;

a compressible dispensing element having an upper surface being capable of receiving a force from said piston and having a liquid passage extending there through, said liquid passage having a liquid inlet in liquid communication with said outlet of said piston flow bore and a liquid outlet;

said liquid passage of said dispensing element being capable of at least partially closing to expel at least a portion of the liquid material from said liquid outlet when said lower surface of said piston applies a force sufficient to compress said dispensing element; and a nozzle in liquid communication with said liquid outlet of said liquid passage for guiding the liquid material expelled from said liquid outlet of said liquid passage towards a substrate.

51. The apparatus of claim 50 comprising a housing that surrounds said compressible dispensing element and constrains the expansion of said dispensing element in a direction generally perpendicular to an applied force when said dispensing element is compressed.

52. The apparatus of claim 51 further comprising a flow restricting element positioned within said flow bore near said outlet of said flow bore.

53. The apparatus of claim 52 wherein said piston is capable of applying a generally uniform compressive force across said dispensing element upper surface.

54. The apparatus of claim 53 wherein said piston lower surface remains in contact with said dispensing element upper surface.

* * * * *